US008678075B2

(12) United States Patent  
Wang et al.

(10) Patent No.: US 8,678,075 B2
(45) Date of Patent: Mar. 25, 2014

(54) HEAT EXCHANGERS AND RELATED METHODS

(75) Inventors: Evelyn N. Wang, Cambridge, MA (US); John G. Brisson, Rockport, MA (US); Stuart A. Jacobson, Lexington, MA (US); Jeffrey H. Lang, Sudbury, MA (US); Matthew McCarthy, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 665 days.

(21) Appl. No.: 12/628,331

(22) Filed: Dec. 1, 2009

(65) Prior Publication Data

US 2010/0170660 A1 Jul. 8, 2010

Related U.S. Application Data

(60) Provisional application No. 61/142,722, filed on Jan. 6, 2009.

(51) Int. Cl.
*H05K 7/20* (2006.01)
*F28F 7/00* (2006.01)
*F28D 15/00* (2006.01)
*H01L 23/467* (2006.01)

(52) U.S. Cl.
USPC ............... 165/80.2; 165/104.26; 165/121; 361/700; 361/696

(58) Field of Classification Search
USPC ........ 165/104.33, 121, 146, 104.26; 361/696, 361/697, 700
See application file for complete search history.

(56) References Cited

U.S. PATENT DOCUMENTS

| 3,844,341 | A | * | 10/1974 | Bimshas et al. ............... 165/86 |
| 4,291,681 | A | | 9/1981 | Berringer |
| 4,660,627 | A | | 4/1987 | Deck |
| 4,733,698 | A | * | 3/1988 | Sato ............................... 138/38 |
| 5,329,993 | A | * | 7/1994 | Ettehadieh ............... 165/104.14 |
| 5,335,143 | A | * | 8/1994 | Maling et al. ................ 361/694 |
| 5,590,708 | A | | 1/1997 | Ulrich |
| 5,794,687 | A | * | 8/1998 | Webster et al. ............... 165/121 |

(Continued)

FOREIGN PATENT DOCUMENTS

JP  2008-281275 A  11/2008
WO  WO 2008/016725  * 7/2008 ............. F28D 1/02
WO  2010/058520  5/2010

OTHER PUBLICATIONS

International Search Report for PCT/US09/66190 (Apr. 2010).

(Continued)

*Primary Examiner* — Allen Flanigan
*Assistant Examiner* — Jason Thompson
(74) *Attorney, Agent, or Firm* — Sam Pasternack; MIT Technology Licensing Office

(57) ABSTRACT

Heat exchanger. The heat exchanger includes a thermal contact plate defining a cavity in fluid communication with a first pipe and a plurality of stationary elements substantially perpendicular to the first pipe each defining a cavity wherein each cavity is in fluid communication with the first pipe and at least one cavity includes a wick. A plurality of movable elements are provided wherein the movable elements and the stationary elements are substantially parallel, alternatingly arranged and a portion of the movable elements overlaps a portion of the stationary elements. A working fluid is provided in the first pipe and cavities or stationary elements and thermal contact plate.

13 Claims, 12 Drawing Sheets

(56) References Cited

U.S. PATENT DOCUMENTS

| | | | |
|---|---|---|---|
| 6,005,772 A * | 12/1999 | Terao et al. | 361/699 |
| 7,128,135 B2 * | 10/2006 | Mok et al. | 165/104.26 |
| 2002/0053726 A1 * | 5/2002 | Mikubo et al. | 257/685 |
| 2002/0056908 A1 * | 5/2002 | Brownell et al. | 257/714 |
| 2003/0196781 A1 | 10/2003 | Wanni et al. | |
| 2005/0126761 A1 * | 6/2005 | Chang et al. | 165/104.33 |
| 2005/0231916 A1 * | 10/2005 | Bahl et al. | 361/700 |
| 2006/0196640 A1 * | 9/2006 | Siu | 165/104.26 |
| 2006/0207750 A1 * | 9/2006 | Chang et al. | 165/104.26 |
| 2007/0068656 A1 * | 3/2007 | Lee et al. | 165/104.26 |
| 2007/0267178 A1 * | 11/2007 | Hou et al. | 165/104.26 |
| 2007/0277963 A1 * | 12/2007 | Hou et al. | 165/104.26 |

OTHER PUBLICATIONS

Written Opinion for PCT/US09/66190 (Apr. 2010).
Japanese Office Action Notification Letter mailed Mar. 5, 2013.

* cited by examiner

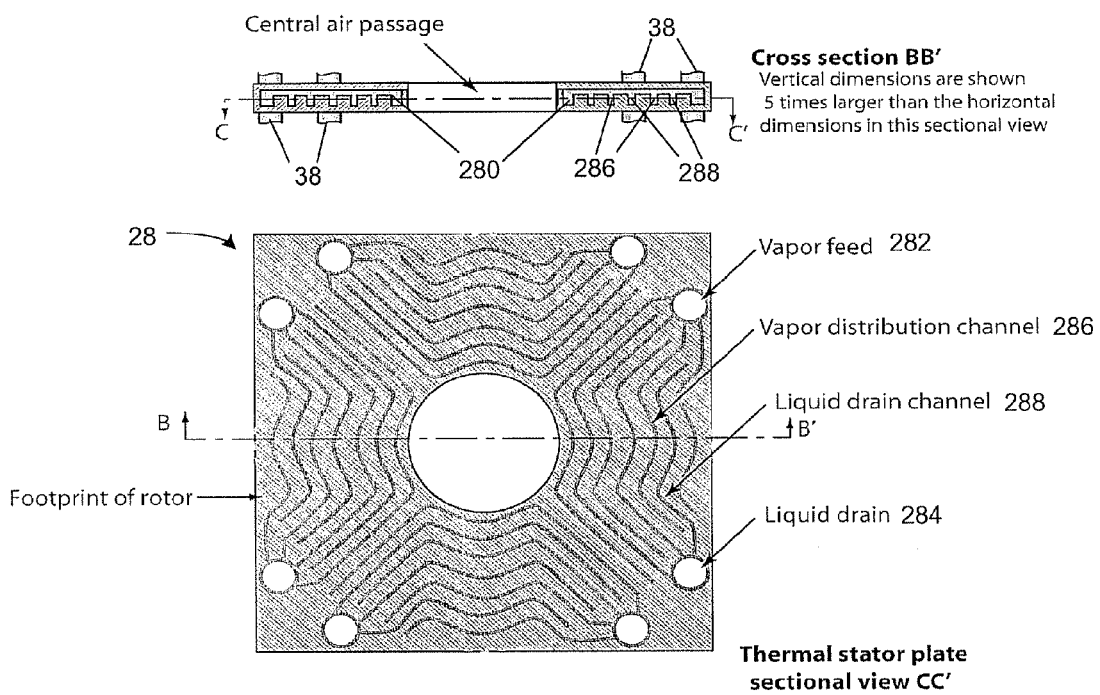
FIG. 4A / FIG. 4B

L

L

HEAT EXCHANGERS AND RELATED METHODS

CROSS-REFERENCE TO RELATED APPLICATIONS

This application claims priority to U.S. provisional application Ser. No. 61/142,722, filed Jan. 6, 2009, the entire contents of each of which are incorporated herein by reference.

STATEMENT REGARDING FEDERALLY SPONSORED RESEARCH OR DEVELOPMENT

This invention was made with government support under Grant Number W31P4Q-09-1-000, awarded by the Defense Advanced Research Projects Agency ("DARPA"). The U.S. government has certain rights in the invention.

TECHNICAL FIELD

The invention relates to heat exchangers and their uses.

BACKGROUND

Many electronic devices, such as semiconductor chip devices (e.g., computers) and telecommunication equipment, generate heat during operation. This heat can adversely affect the performance and/or service life of the devices, so for these devices to operate well for an extended period of time, the devices should be cooled. A device can be cooled, for example, with a fan that blows cooler air to the device or draws heated air away from the device.

SUMMARY

The invention relates to heat exchangers and their uses (e.g., methods of cooling devices).

In one aspect, the invention features a device including a stationary element defining a cavity; a movable element; and a first heat pipe in fluid communication with the cavity defined by the stationary element. In various aspects, the device features a movable element with a plurality of blades. In another aspect, the movable element and the stationary element are substantially parallel, and a portion of the movable element overlaps a portion of the stationary element. In various embodiments, the movable element overlaps at least 30%, 60%, or more, of the surface area of the stationary element. In another aspect, the device features a plurality of stationary elements alternatingly arranged with a plurality of movable elements.

In another aspect the device includes a thermal contact plate defining a cavity in fluid communication with the heat pipe.

In another aspect the device includes a motor adapted to rotate the movable element. In various aspects the motor is a permanent-magnet, synchronous motor.

In another aspect the device includes a wick in the stationary element cavity. In various embodiments the device includes a wick in the heat pipe. In some embodiments the wick is a composition of sintered particles. In some aspects, the wick is a series of pillars with a height in the range of approximately 10 μm to approximately 100 μm, a width in the range of approximately 500 nm to approximately 50 μm and a length in the range of approximately 500 nm to approximately 50 μm and a pitch in the range of approximately 500 nm to approximately 50 μm.

In another aspect the device has a total volume of not more than about 64 cubic inches. In various embodiments the device has overall in the range of about 5 cm to about 10 cm, by about 5 cm to about 10 cm, by about 5 cm to about 10 cm.

In another aspect the stationary element, movable element, thermal contact plate, heat pipes and/or any of the components of the device may be constructed from copper, aluminum, silicon, graphite, steel, stainless steel, titanium, diamond, silver, graphene, alloys thereof and combinations thereof.

In another aspect the device may include a working fluid in the heat pipe and the cavity defined by the stationary element. In various embodiments the working fluid may be water, ammonia, methanol, ethanol, and combinations thereof. In another aspect the working fluid may have a vaporization temperature between approximately 40° C. to approximately 150° C.

In various embodiments the stationary element and associated heat pipe sections are constructed from a monoblock. In various embodiments the first heat pipe section extends a distance above a top surface of the stationary element, a second heat pipe section extends a distance below a bottom surface of the stationary element, and a plurality of stationary elements stacked equidistant from each other.

In another aspect the movable element defines a cavity.

In another aspect the device includes a second heat pipe in communication with the movable element cavity and a thermal contact plate defining a cavity.

In another aspect the heat pipes have a diameter of less than about 1 mm or a diameter of less than about 5 mm.

In another aspect the heat pipe and the stationary element are made from the same material.

In various embodiments the device has an overall thermal resistivity less than about 0.5 K/W. In various embodiments the device can dissipate between about 0.25 kW to about 1 kW of heat.

In one aspect, the invention features a method including transferring heat from the load to a thermal contact plate defining a cavity, flowing a working fluid from the cavity defined by the thermal contact plate through a first heat pipe distinct from the thermal contact plate and moving movable elements relative to stationary elements. In another aspect the method includes flowing the working fluid from the first heat pipe to a cavity defined by a stationary element. In various embodiments the method includes wicking the working fluid from the cavity defined by the stationary element to the cavity defined by the thermal contact plate.

In another aspect the method includes movable elements with a plurality of blades. In another aspect the method includes movable elements and stationary elements that are substantially parallel, and portions of the movable elements overlap portions of the stationary elements. In another aspect the method includes movable elements that overlap at least 30%, 60% or more of the surface areas of the stationary elements. In another aspect the method includes stationary elements that are alternatingly arranged with the movable elements.

In another aspect the method includes a portion of the movable elements that overlap with a portion of the stationary elements. In various embodiments the method includes rotating the movable elements.

In another aspect the method includes flowing a second working fluid from a second heat pipe to a cavity defined by a movable element.

In another aspect the method includes preventing air flow in a same direction as a flow of the working fluid from the cavity defined by the thermal contact plate through a first heat pipe.

In another aspect the method includes a load from a device that may be a semiconductor chip.

In another aspect the method includes rotating the movable elements with a motor. In another aspect the method includes a motor, and the motor may be a permanent-magnet, synchronous motor.

In another aspect the method includes wicking the working fluid with sintered particles. In various embodiments the method includes wicking the working fluid with a series of pillars with a height in the range of approximately 10 μm to approximately 100 μm, a width in the range of approximately 500 nm to approximately 50 μm and a length in the range of approximately 500 nm to approximately 50 μm and a pitch in the range of approximately 500 nm to approximately 50 μm.

In another aspect the heat is reduced with a device having a total volume of not more than about 64 cubic inches. In various embodiments, the heat is reduced with a device having overall dimensions of about 10 cm, by about 10 cm, by about 10 cm. In another aspect the heat is reduced with a device having an overall thermal resistivity less than about 0.5 K/W. In another aspect the method includes dissipating about 1 kW of heat.

In another aspect the method includes stationary elements, movable elements, thermal contact plate, heat pipes, or any component of the device constructed from copper, aluminum, silicon, graphite, steel, stainless steel, titanium, diamond, silver, graphene, alloys thereof and combinations thereof. In various embodiments, the method includes a first heat pipe and stationary elements constructed from the same material In another aspect the method includes a working fluid which may be water, ammonia, methanol, ethanol, or combinations thereof. In various embodiments, the method includes a working fluid that has a vaporization temperature in the range of from approximately 40° C. to approximately 150° C.

In another aspect the method includes stationary elements that have associated heat pipe sections unitarily constructed with the stationary elements.

In another aspect the method includes a movable element that defines a cavity.

In another aspect the method includes flowing a working fluid through a cavity defined by a movable element.

In another aspect the method includes a first heat pipe that has a diameter of less than about 1 mm, or less than about 5 mm.

In one aspect the invention features a method including moving movable elements relative to stationary elements to flow air between the stationary elements, wherein the movable elements and the stationary elements are alternatingly arranged, and at least a portion of the movable elements overlaps with a portion of the stationary elements.

As used herein, "'vapor' heat pipe" and "'liquid' heat pipe" are used to conveniently describe embodiments of the invention. These terms do not mean that the heat pipes can only transport a particular phase of a working fluid or a particular type of working fluid.

Other aspects, features and advantages will be apparent from the description of the following embodiments and from the claims.

BRIEF DESCRIPTION OF DRAWINGS

FIG. 4A is a plan view of an embodiment of a stator; and FIG. 4B is a cross-sectional view of the rotor shown in FIG. 4, taken along line B-B'.

DETAILED DESCRIPTION OF CERTAIN EMBODIMENTS

Figure 1:
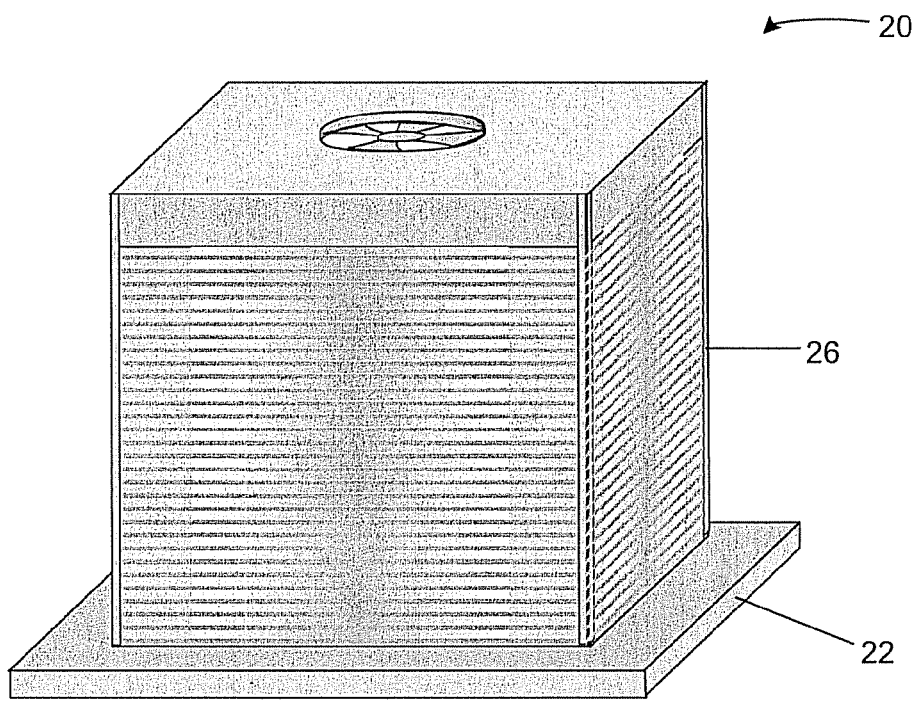
FIG. 1 is a perspective view of an embodiment of a heat exchanger.
Figure 2A:
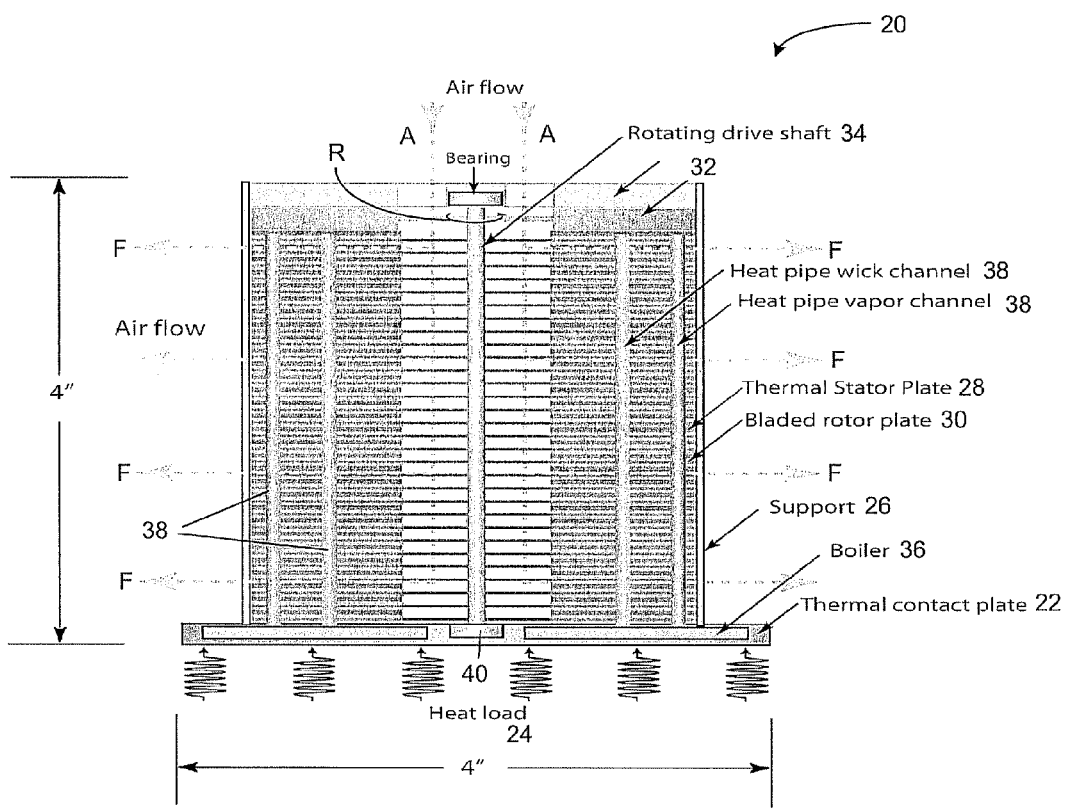
FIG. 2A is a cross-sectional view of the heat exchanger shown in FIG. 1.
Figure 2B:
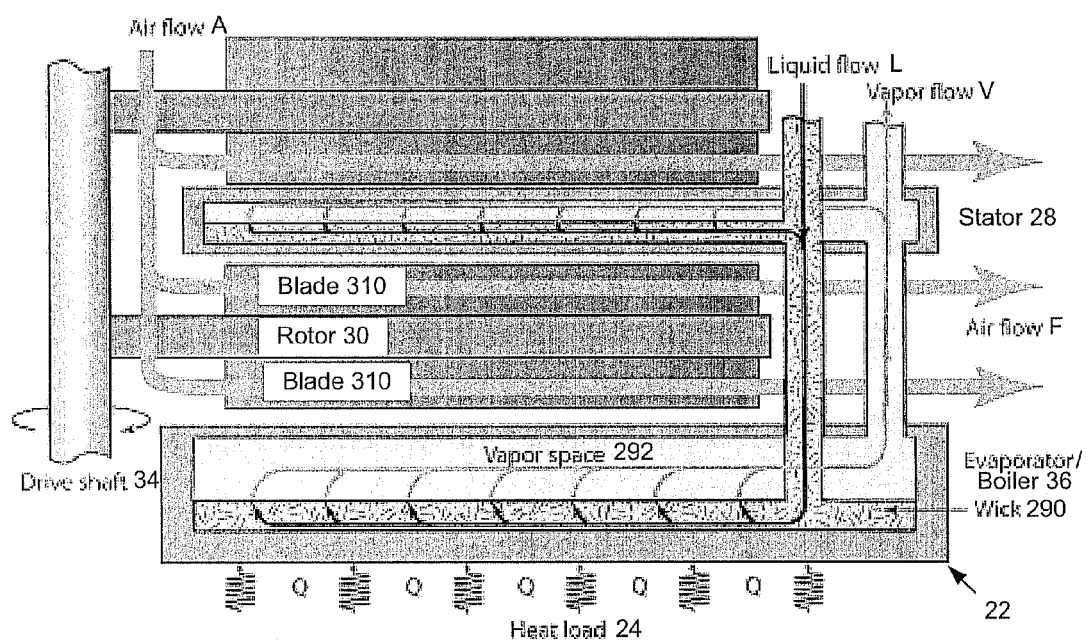
FIG. 2B is a detail sectional view of a portion of the heat exchanger shown in FIG. 1.

FIGS. 1, 2A and 2B show a heat exchanger 20 capable of dissipating heat generated by a load, such as a device having a semiconductor chip. Heat exchanger 20 includes a thermal contact plate 22 that receives a heat load 24, and a support or housing 26 that extends from the thermal contact plate. Within support 26, exchanger 20 includes a stack of thermal stator plates (or stators) 28 and bladed rotor plates (or rotors) 30. Stators 28 and rotors 30 are generally parallel to thermal contact plate 22 and to each other, and are stacked in alternating fashion. Rotors 30 are capable of moving between stators 28 by a motor 32 that is coupled to the rotors by a rotatable (arrow R) drive draft 34. Exchanger 20 further includes a boiler 36 within thermal contact plate 22, and a plurality of heat pipes 38 that extends from the thermal contact plate 22 to stators 28. As described more below, heat pipes 38 contain a working fluid that is capable of flowing through the heat pipes 38, thermal contact plate 22, and stators 28.

Briefly, in operation, heat load 24 is applied to thermal contact plate 22, and motor 32 is activated to rotate rotors 30. The applied heat load 24 is absorbed by the working fluid and causes the working fluid to flow through thermal contact plate 22, heat pipes 36, and stators 28. Concurrently, air flow is introduced into exchanger 20 (arrow A) by movement of rotors 30. The air flows parallel to drive shaft 34 and between stators 28 and rotors 30 (arrow F) to cool the working fluid in heat pipes 36 and stators 28. As a result, heat load 24 is dissipated.

Figures 3A, 3B:
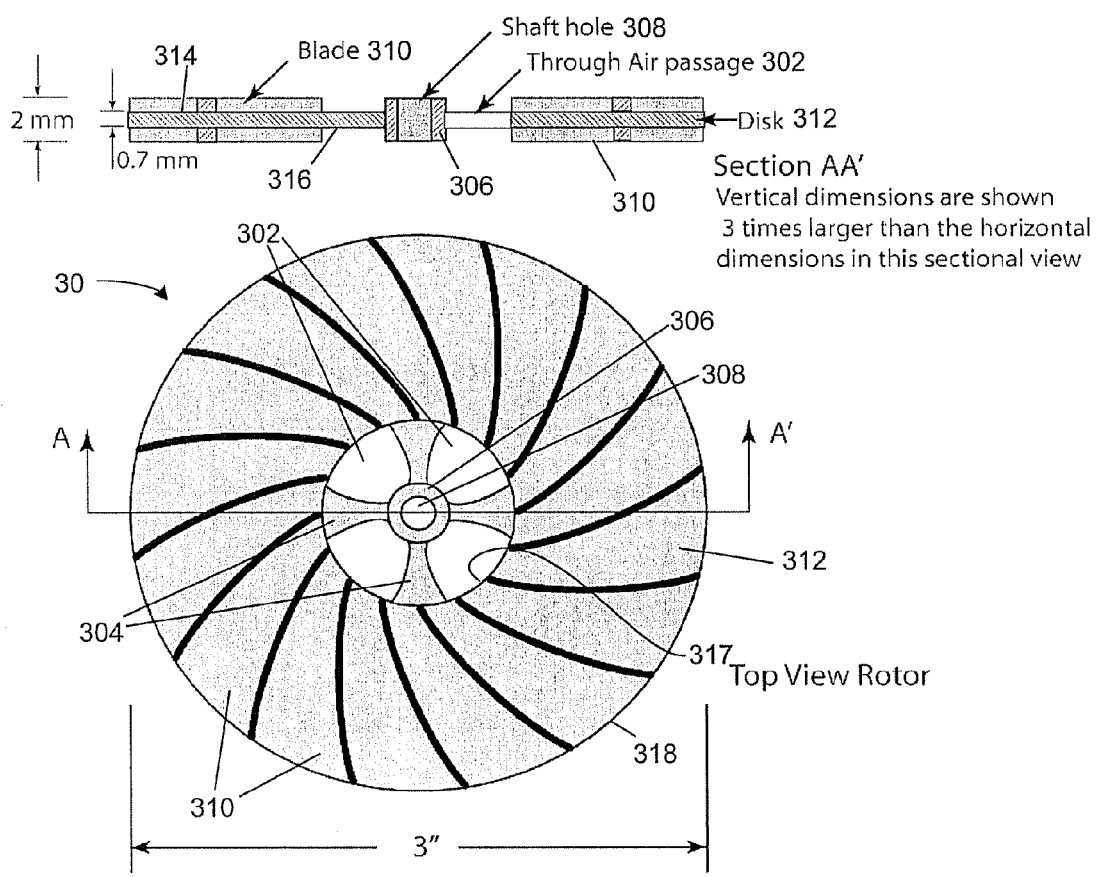
FIG. 3A is a plan view of an embodiment of a rotor.
FIG. 3B is a cross-sectional view of the rotor shown in FIG. 3A, taken along line A-A'.
Figure 5A:
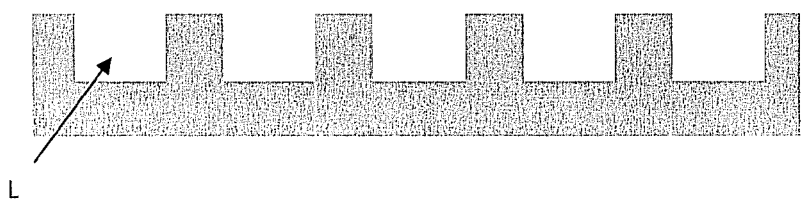
FIG. 5A is a cross sectional view of a grooved wick design, showing liquid flow L direction.
Figure 5B:
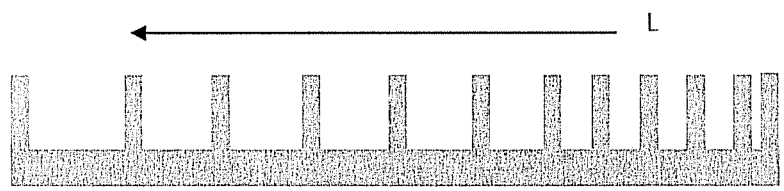
FIG. 5B is a cross sectional view of a pillar/protrusion wick design, showing liquid flow L direction.

Rotors 30 are configured to facilitate air flow through heat exchanger 20 when they are moved relative to stators 28. Referring to FIGS. 3A and 3B, each rotor 30 includes a rotor hub 306 that defines a shaft hole 308; a plurality of spokes 304 connected to and extending radially from the rotor hub; a solid, circular disk 312 connected to the spokes; and a plurality of blades 310 on the disk. Shaft hole 308 is configured to receive drive shaft 34 such that the drive shaft can engage with rotor hub 306 to rotate rotor 30. Between spokes 304 and disk 312, each rotor 30 defines a plurality of through air passages 302 that facilitate air flow throughout heat exchanger 20 (arrow A), and between the rotors 30 and stators 28. As shown in FIGS. 3A and 3B, each rotor 30 has a generally circular disk 312, but in other embodiments, the disk has non-circular shapes (e.g., oval, elliptical, regularly or irregularly polygonal). Disk 312 can also have a shape that include multiple lobes that extend radially outward.

Still referring to FIGS. 3A and 3B, each disk 312 includes blades 310 configured to enhance air flow through heat exchanger 20. As shown, disk 312 includes a top surface 314 and a bottom surface 316, and blades 310 are on both surfaces. Blades 310 extend in both the axial and radial directions from surfaces 314, 316. A blade 310 may extend axially from each surface 314, 316 in a generally perpendicular direction, but in other embodiments, the blade may be otherwise angled relative to the surfaces. A blade 310 may extend radially, wholly or partially, from an inner edge 317 of disk 312 to an outer edge 318 of the disk. A blade 310 may extend in a straight radial direction, or the blade may be curved (as shown in FIG. 3B). A blade 310 may be curved in a direction opposite to the direction of rotation of rotor 30. Blades 310 on surfaces 314, 316 can be configured the same or differently. In some embodiments, disk 312 includes blades 310 on only one surface 314 or 316.

Rotor 30 can include (e.g., be constructed solely of) any rigid, mechanically robust material. Examples of materials also include those with high thermal conductivity, such as, for example, copper, aluminum, silicon, graphite, steel, stainless steel, titanium, diamond, silver, graphene, alloys thereof and combinations thereof. The components of rotor 30 may be constructed from the same material, or they may be constructed from different materials, in any combination. As an example, hub 306 and spokes 304 may be constructed from one material, and disk 312 may be constructed from another material. The components of rotor 30 may be constructed from a single block of material, or the components may be constructed separately and subsequently assembled to form the rotor. As an example, disk 312, spokes 304, and hub 306 may be formed separately and assembled to form rotor 30.

The dimensions of rotor 30 are not limited. In some embodiments, rotor 30 has a diameter in the range of about 25 mm to about 300 mm, e.g., about 80 mm or about 100 mm.

Referring to FIGS. 4A and 4B, each stator 28 is configured to dissipate heat carried by the working fluid flowing from boiler 36 and heat pipes 38. As shown, each stator 28 defines a plurality of internal cavities or vapor chambers 280 (as shown, four), a plurality of vapor feed openings 282, and a plurality of liquid drain openings 284. Each vapor chamber 280 is in fluid communication with one vapor feed opening 282 and one liquid drain opening 284. Each vapor feed opening 282 and each liquid drain opening 284 are in turn in fluid communication with a separate heat pipe 38 that is in fluid communication with boiler 36. As a result, the working fluid is capable of flowing from boiler 36, through a first "vapor" heat pipe 38, through a vapor feed opening 282, into a vapor chamber 280, through a liquid drain opening 284, through a second "liquid" heat pipe 38, and back to the boiler. By flowing the working fluid across the large surface area of stator 28, heat dissipation from load 24 can be enhanced.

Other embodiments of vapor chambers 280 and heat pipes 38 can be constructed. For example, each of the vapor chambers 280 in a stator 28 can have an identical arrangement of heat pipes 38. A single heat pipe 38 can be used to deliver the working fluid to the vapor chamber 280, and a second single heat pipe can be used to deliver the working fluid away from the vapor chamber 280. Multiple heat pipes 38 can be used to deliver the working fluid to the vapor chamber 280, and/or multiple heat pipes 38 can be used to deliver the working fluid away from the vapor chamber 280. The arrangements of heat pipes 38 need not be identical for each vapor chamber 280 in a stator 28. The number of heat pipes 38 delivering working fluid to the vapor chamber 280 need not match the number of heat pipes 38 delivering working fluid away from the vapor chamber 280.

Referring particularly to FIG. 4B, each vapor chamber 280 includes multiple channels that increases the surface area of the vapor chamber. Some of these channels 286 abut vapor feed opening 282 and help to distribute the working fluid (e.g., vaporized working fluid) from the vapor feed opening to across stator 28. Other channels 288 abut liquid drain opening 284 and help to drain the working fluid (e.g., liquid working fluid) from vapor chamber 280 to liquid drain opening 284. Thus, as working fluid (e.g., vaporized working fluid and/or heated working fluid) enters a vapor chamber 280 via a "vapor" heat pipe 38 and a vapor feed opening 282, the working fluid is distributed across stator 28 by channels 286. When the working fluid is subsequently cooled, the working fluid (e.g., condensed liquid and/or cooled working fluid) can flow across channels 228, to liquid drain opening 284, and back to boiler 26 via a "liquid" heat pipe 38.

In some embodiments, liquid flow L in vapor chambers 280 (e.g., in liquid drain channels 288) and the "liquid" heat pipes 38 is accomplished or aided by a wicking material 290 in the vapor chambers 280 and/or the heat pipes. The wicking material 290 may include sintered particles, (e.g., sintered copper particles), carbon nanotubes, silicon or copper protrusions. In some embodiments, the wicking material 290 includes a series of protrusions (e.g., pillars) extending from the interior surfaces of vapor chamber 280 and/or the "liquid" heat pipes 38. The protrusions may be sized, and arranged in any manner to flow a working fluid by wicking or surface tension. In some embodiments, the protrusions may have millimeter or smaller dimensions. The protrusions may be arranged in a field with a pitch of millimeter to micron dimensions. The protrusions may have dimensions in the range of about 500 nm to about 50 um in length, and in the range of about 500 nm to about 50 um in width, and in the range of about 10 um to about 100 um in height. Further, the protrusions may be spaced in a center-to-center pitch of a range of about 500 nm to about 50 um. The pitch need not be consistent over the field of the pillars. The pitch can vary in any direction across the field of protrusions and in any manner. For example, the pitch may vary to direct flow in a particular direction. The protrusions may vary in size and shape, depending on the application and the physical properties of the working fluid. An example of the protrusions is shown in, Krupenkin, T. N., J. A. Taylor, E. N. Wang, P. Kolodner, M. Hodes, and T. R. Salamon, Reversible Wetting-Dewetting Transitions on Electrically Tunable Superhydrophobic Nanostructured Surfaces Langmuir, 2007 23(18) p. 9128-9133, which is incorporated by reference. Stator 28 can include (e.g., be constructed solely of) any rigid material. Examples of materials include those with high thermal conductivity, such as, for example, copper, aluminum, silicon, graphite, steel, stainless steel, titanium, diamond, silver, graphene, alloys thereof and combinations thereof. In various embodiments, stator 28 and heat pipes 38 connected to vapor feed openings 282 and liquid drain openings 284 are constructed from a single block of material (a "monoblock"). In various embodiments, heat pipes 38 associated with stator 28 extend above a top surface of the stator, and below a bottom surface of the stator so that when a plurality of stators are stacked, the stators are all equidistant.

The successful operation of the heat pipe relies on efficient wicking of the water through the complex stacked geometry. Various wick sizes are necessary to create high driving pressures in the evaporator and low permeabilities in the fluid transport sections.

Additionally, the condensers require adequate capillary force to withstand the tendency of gravity to flood the lower layers with liquid from the higher layers. A two-level wick design in the condenser sections will enable the device to be insensitive to orientation. The 1 µm pore primary wick in the evaporator provides a large capillary pressure to overcome viscous losses, while the ~100 µm (large-pore) wick provides a high-permeability path for liquid flow and the ~10 µm (small-pore) wick provides a high burst pressure to prevent backflow.

The dimensions of stator 28 are not limited. In some embodiments, each stator 28 has a generally planar. The shape of stators 28 can be circular, oval, elliptical, or regularly or irregularly polygonal having three, four, five, six, seven, or eight or more sides. Stators 28 may generally define the footprint of heat exchanger 20, but in other embodiments, the stators have a smaller footprint than the thermal contact plate 22, and do not define the footprint of the heat exchanger. The stack of stators 28, in addition to the motor 32 may generally define the height of heat exchanger 20. In various embodiments, each stator 28 has a length and/or a width in the range of about 25 mm to about 300 mm. In various embodiments, the stators have a height of about 1 mm to about 25 mm. Stators 28 of different shapes and/or sizes can be used to construct heat exchanger 20.

As shown, stators 28 and rotors 30 are constructed such that they overlap when stacked, as viewed along the longitudinal axis of the stack. Rotors 30 may overlap any portion of the surface area of stators 28. The amount of surface area that is overlapped may vary depending on the application and construction of the heat exchanger 20. In some embodiments, at least one rotor 30 overlaps at least one stator 28 by at least about 10%, at least about 20%, at least about 30%, at least about 40%, at least about 50%, at least about 60%, at least about 70%, at least about 80%, or at least about 90% of the surface area of the stator. Stators 28 and rotors 30 are arranged so that the rotors may rotate freely and do not interfere with the stators. In some embodiments, the distance or gap between a surface of a rotor 30 and the closest surface of a stator 28 ranges from about 300 um to about 1 mm.

Referring again to FIG. 2A, heat pipes 38 are configured to transport the working fluid between boiler 36 and stators 28. As discussed above, each vapor chamber 280 of a stator 28 can independently include one or more "vapor" heat pipes 38 that deliver the working fluid to the vapor chamber, and one or more "liquid" heat pipes that deliver the working fluid away from the vapor chamber. The "liquid" heat pipes 38 can contain a wicking material 290, as described above.

Heat pipes 38 can include (e.g., be constructed solely of) any rigid material. Examples of materials include those with high thermal conductivity, such as, for example, copper, aluminum, silicon, graphite, steel, stainless steel, titanium, diamond, silver, graphene, alloys thereof and combinations thereof. As described above, heat pipes 38 may be constructed from a single block of material with stators 28. Further, the cross section of heat pipes 38 may be formed in any shape (e.g., circular, oval, elliptical, or regularly or irregularly polygonal having three, four, five, six, seven, or eight or more sides). As shown, heat pipes 38 generally extend from thermal contact plate 22 in a perpendicular direction to stators 28, however, alternate paths for the heat pipes may be utilized.

Still referring to FIG. 2A, thermal contact plate 22 is configured to be in direct contact with heat load 24. In various embodiments, a heat conducting paste or other material is used between thermal contact plate 22 and heat load 24. Thermal contact plate 22 can be of any size or shape to accommodate the size or shape of the source of heat load 24, or to accommodate any requirements of the application. For example, the cross section of thermal contact plate 22 may be formed in any shape (e.g., circular, oval, elliptical, or regularly or irregularly polygonal having three, four, five, six, seven, or eight or more sides). As shown, thermal contact plate 22 is substantially planar. In some embodiments, thermal contact plate 22 has length and width in the range of about 25 mm to about 300 mm, and a height in the range of about 1 mm to about 25 mm.

Thermal contact plate 22 can include (e.g., be constructed solely of) any rigid material. Examples of materials include those with high thermal conductivity, such as, for example, copper, aluminum, silicon, graphite, steel, stainless steel, titanium, diamond, silver, graphene, alloys thereof and combinations thereof.

Within thermal contact plate 22, heat exchanger 20 includes boiler 36, which contains the working fluid and is in fluid communication with heat pipes 38. During operation, heat from heat load 24 is transferred to the working fluid in boiler 36. The heated (e.g., vaporized or liquid) working fluid can then flow ("vapor" flow V) from boiler 36 to stators 28 via heat pipes 38. A heat exchanger can have multiple, separate boilers 36, wherein each boiler is in fluid communication with one or more vapor chambers 280 and not in fluid communication with other vapor chamber(s). Alternatively, a heat exchanger can have a single boiler (e.g., an annularly-shaped boiler) that is in fluid communication with all the vapor chambers 280.

Motor 32 is configured to move rotatable drive shaft 34, thereby rotating rotors 30 that are engaged with the shaft via rotor hub 306. Rotation of drive shaft 34 and rotors 30 generates air flow through heat exchanger 20 (arrows A and F). The rate of air flow may be controlled by the rotational speed of rotors 30. The rotational speed of rotors 30 may range from about 60 rpm to about 10,000 rpm, for example. In various embodiments, airflow enters from the uppermost rotor 30 and flows toward thermal contact plate 22 and radially through gaps between rotors 30 and stators 28. In various embodiments, the direction of airflow is countercurrent to the direction of working fluid flow from boiler 36 to stators 28. An example of motor 32 is a permanent-magnet, synchronous motor, as described in Arnold, D. P., et al., Microfabricated High-Speed Axial-Flux Multiwatt Permanent-Magnet Generators—Part I: Modeling, Journal of Micromechanics and Microengineering, 2006. 15: p. 1330-50. Arnold, D. P., et al., Microfabricated High-Speed Axial-Flux Multiwatt Permanent-Magnet Generators—Part II: Design and Testing, Journal of Micromechanics and Microengineering, 2006. 15: p. 1351-63. Arnold, D. P., et al., Design optimization of an 8-Watt microscale axial-flux permanent magnet generator, Journal of Micromechanics and Microengineering, 2006. 16: p. S290-S297, each of which are incorporated by reference.

The working fluid can include any fluid capable of absorbing and releasing heat. The working fluid can be a liquid or a gas at atmospheric temperature and pressure. The working fluid can be present in heat exchanger 20 at sub-atmospheric pressure (e.g., under vacuum), at atmospheric pressure, or at high pressures (e.g., greater than 1 atm to about 5 atm). In some embodiments, the working fluid has a vaporization temperature in the range from about −25° C. to about 200° C., e.g. from about 40° C. to about 150° C. More than one working fluid can be present in heat exchanger 20. For example, a second working fluid may be mixed (miscibly or immiscibly) with a first working fluid. Multiple working fluids can be kept separated from each other by forming boilers 36, heat pipes 38, and vapor chambers 280 that are not in fluid communication with other boiler(s), heat pipe(s), and/or vapor chamber(s). Examples of working fluid include water, ammonia, methanol, ethanol, and combinations thereof.

In operation, heat exchanger 20 is configured to transfer heat from heat source 24 (e.g., a semiconductor device) to the surrounding environment. More specifically, heat transfers from heat load 24 to thermal contact plate 22 and then to the working fluid contained in boiler 36. The heated working fluid flows towards stators 28 through "vapor" heat pipes 38. Heat is transferred from the working fluid to heat pipes 38. The working fluid then flows into and through vapor chambers 280 (e.g., along vapor distribution channels 286), and cools. The cooled working fluid flows (e.g., via wicking action along liquid drain channels 288) to a second "liquid" heat pipe 38. The working fluid then flows through second "liquid" heat pipe 38 and returns to boiler 36. In some embodiments, cooled working fluid returns to boiler 36 via "vapor" heat pipes 38.

As the working fluid flows through heat exchanger 20, motor 32 rotates rotors 30 to move air through the heat exchanger (arrows A and F). The air flow dissipates heat from stators 28, heat pipes 38 and other components of heat exchanger 20. Quiescent air flow may also dissipate heat from the heat exchanger 20.

Heat exchanger 20 may be used to dissipate any heat load 24 from any source. In various embodiments, heat exchanger 20 has an overall thermal resistivity of about 0.5 K/W. In various embodiments, heat exchanger 20 has the capacity to dissipate about 1 kW of heat energy. In various embodiments, heat exchanger 20 occupies a volume of not more than about 1050 cubic centimeters. In various embodiments, one or more dimensions of heat exchanger 20 are in the range of about 25 mm to about 300 mm.

While a number of embodiments have been described, the invention is not so limited.

For example, alternatively or additionally to stators 28 defining cavities, rotors 30 can define cavities. The cavities defined by rotors 30 can be similar to the cavities defined by stators 28. A working fluid can be delivered to and from rotors 30 through drive shaft 34. In various embodiments, the working fluid can be delivered to and from the rotor cavity through a heat pipe 38 parallel to the drive shaft 34.

As another example, one or more (e.g., all) of the stators may not include a vapor chamber. Heat pipes 38 can make physical contact with these stators to dissipate heat from the working fluid flowing from boiler 36 (e.g., like conventional heat fins), but no working fluid flows in the stators.

In some embodiments, rotors 30 and stators 28 do not overlap. For example, the outermost width or diameter of rotors 30 can be equal to or less than the width or diameter of the central openings defined by stators 28.

While rotors 30 ("R") and stators 28 ("S") are shown as alternating as "R, S, R, S, etc." in the Figures, in other embodiments, the rotors and stators can stacked differently, e.g., with multiple rotors between stators or vice versa. For example, rotors 30 and stators 28 can be stacked as "R, R, S, R, R, S, . . . "; "S, S, R, S, S, R, . . . "; "R, R, S, S, R, R, S, S, . . . ". More than two (e.g., 3, 4, 5 or more) rotors can be between two or more stators; and/or more than two (e.g., 3, 4, 5 or more) stators can be between two or more rotors.

The heat exchanger system can have multiple parallel flat condensers 50 as the stators that are stacked in a gravity field. Wick structures 290 in these condensers are used to distribute and fix the locations of the condensation process.

In some embodiments a bi-layer wick design is used to compensate for the pressure variations that can occur with gravity and orientation. The bi-layer design combines the high permeability of the large pore sinter to act as a through way for the liquid out of the condenser and fine pore sinter to act as a barrier to prevent the flooding of a condenser during normal operation.

Due to variations in manufacturing, the ability of sinter to compensate for pressure differences between the liquid and vapor is dramatically larger when the vapor pressure is higher than the liquid pressure as opposed to when the liquid pressure is higher than the vapor pressure. This is due to the differences in the advancing and receding contact angles and especially the variation of the sizes of the defects in the sinter surface.

A design that compensates for and takes advantage of this effect reduces the pressure on the liquid side of the evaporator and condenser wicks below that of the vapor side. The pressure on the liquid side of the machine can be maintained mechanically, thermally, actively or passively. Examples of these include an actively controlled piston that is moved to maintain a prescribed pressure on the liquid side of the machine. Active cooling or heating of liquid and gas in a volume (a compensation volume) can also be used to control the liquid side pressure. Passive mechanical compensation methods could include using compliant elements to hold the pressure at a preselected level. This could be done, for example, using non-condensable-gas-filled bellows in the liquid space. Thermally passive compensation methods include intentionally creating a vapor bubble in a section of the liquid space at a temperature related to the environmental and operating temperatures to pin liquid side pressure to the saturation pressure of that bubble.

Figure 6:
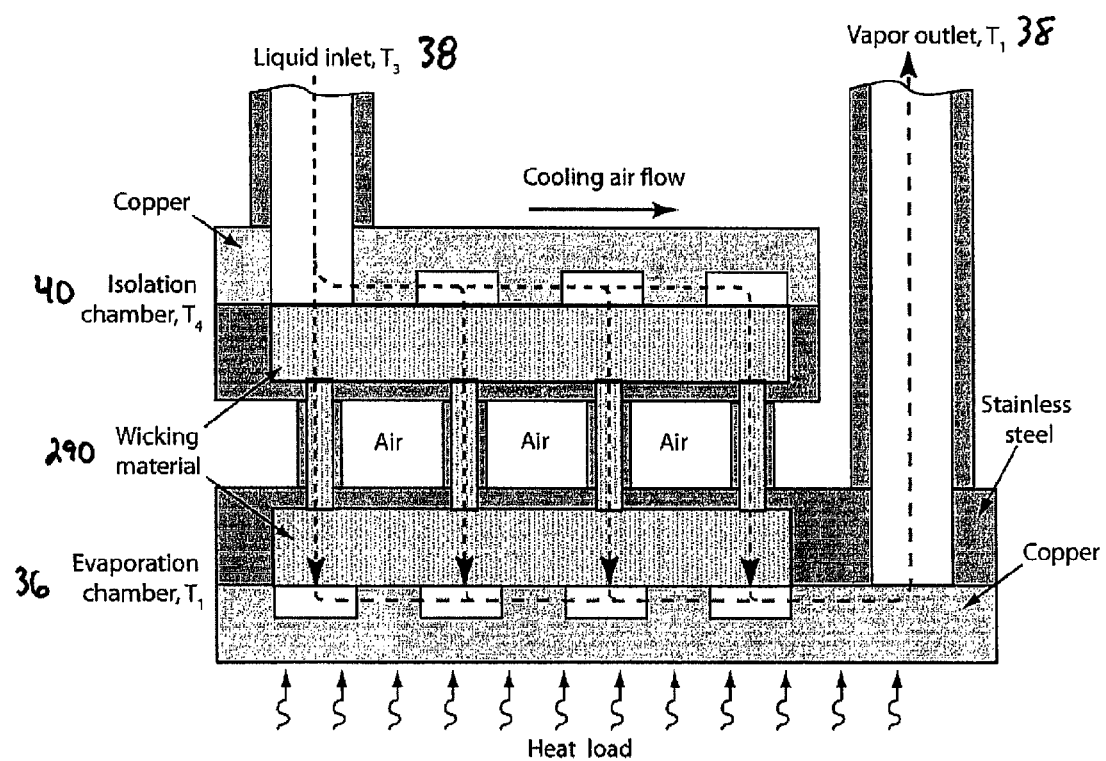
FIG. 6 shows an embodiment of an evaporator assembly with isolation chamber.

Referring to FIG. 6, a more specific embodiment of a thermally passive compensated design is shown. FIG. 6 is a simplified drawing of the evaporator system. Heat flows into the bottom of the evaporator 36 to a fine wick structure 290 where vapor evaporates from the surface of the wick structure 290. The vapor is collected in open channels and flows out the vapor outlet 38 at a temperature $T_1$. Liquid flows through the liquid inlet port 38 into the isolation chamber. The liquid is passed through open channels in the isolation chamber where it passes into the wick material 290 and flows through the wick to the vapor channels at the bottom of the evaporator. The isolation chamber is held at a temperature $T_4$ that is low enough so that the liquid in the open liquid passages does not boil by a cooling airflow on its top surface. The isolation chamber 40 and evaporation chamber 36 are separated by an insulating material (air in FIG. 6) to minimize the heat transfer from one chamber to the other.

Figure 7:
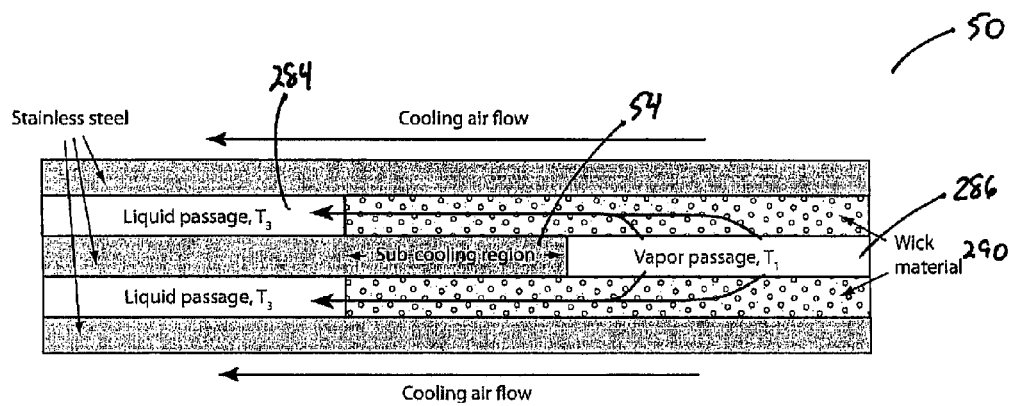
FIG. 7 shows a simplified cross-sectional view of an embodiment of a condenser with a subcooler assembly

Referring to FIG. 7, a simplified cross-sectional drawing of a condenser 50 is shown. The condenser, in certain embodiments, may be part of the stator 28. The flows of the vapor and liquid in their corresponding open passages (286 and 284 respectively) are normal to the plane of the diagram. The condenser is cooled on both sides by an air flow. Saturated vapor at temperature $T_1$ condenses onto the wick surfaces and the resulting liquid flows into the wick 290 towards the liquid passage. As the liquid flows through the wick 290, it enters a region 54 of wick that acts to subcool the liquid as it flows from the saturation temperature $T_1$ to temperature $T_3$. The pressure of the liquid in the liquid channel is held high enough to prevent boiling of the liquid as it emerges from the sinter. More specifically, this means that the temperature $T_3$ must be below the saturation temperature of the liquid in the liquid channel of the condenser.

Figure 8:
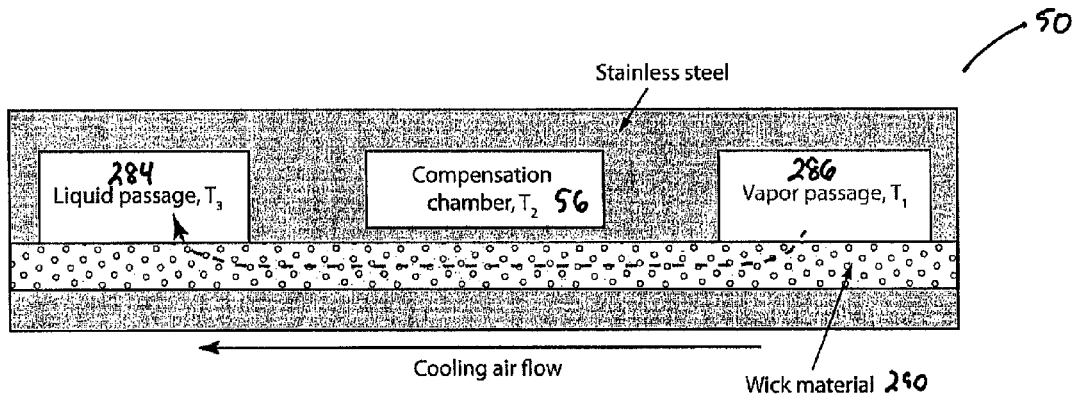
FIG. 8 shows a simplified cross-sectional view of an embodiment of a condenser with a compensation chamber assembly.

FIG. 8 is a simplified cross-sectional drawing of a condenser 50 fitted with a compensation chamber 56. Once again, the flows of the vapor and liquid in their corresponding open passages (286 and 284 respectively) are normal to the plane of the diagram. The compensation chamber 56 is an open space that is connected to the liquid return to the evaporator assembly. In operation, the compensation chamber is filled with both liquid and vapor. This condenser/compensator is cooled on one side by an air flow. Saturated vapor at temperature $T_1$ condenses onto the wick surfaces 290 and the resulting liquid flows into the wick towards the liquid passage. As the liquid flows through the wick 290 it is subcooled from the saturation temperature $T_1$ to temperature $T_3$. The compensation chamber 56 is located between the vapor and liquid channels and is in good thermal contact with the central section of the subcooling section of the wick structure. As a consequence, the compensation chamber 56 will be held at a temperature $T_2$ that is between the temperature of the vapor entering the condenser, $T_1$, and the temperature $T_3$, of the liquid exiting the condensers. Since temperature $T_2$ is the highest temperature in the open liquid channels 284 ($T_1 > T_2 > T_3 \sim T_4$) vapor will preferentially form in this space, locking the pressure throughout the liquid channels 284 to the vapor pressure associated with the temperature $T_2$.

A single condenser 50 with the compensation chamber 56 would be placed at the top of the stack of condensers or stators. All the condensers would be connected to the evaporator in a manner similar described above via heat pipes 38. Further, the compensation chamber would be connected to the liquid side of all the condensers via a design similar to the heat pipes.

In operation, maintaining the compensation chamber at a temperature lower than the saturated vapor temperature insures that the meniscuses in both the condensers and the evaporator are receding (the meniscus presents a concave surface to the vapor) which is the direction where large pressure differentials can be compensated by surface tension effects. The lower bound on the compensation chamber temperature is determined by the highest temperature elsewhere in the open liquid space of the device. If the temperature elsewhere in the liquid passages is higher than the temperature of the compensation chamber, vapor will form there and the gas bubble in the compensation chamber will collapse. The pressure on the liquid side of the system will then be the vapor pressure of the high temperature in the liquid passage.

The thermal compensation chamber 56 is not limited to installation in a condenser plate. The compensation chamber 56 could, for example, be placed between the isolation chamber and the evaporator chamber and maintained at a temperature between the temperatures of those two chambers.

Example 1

Figure 12:
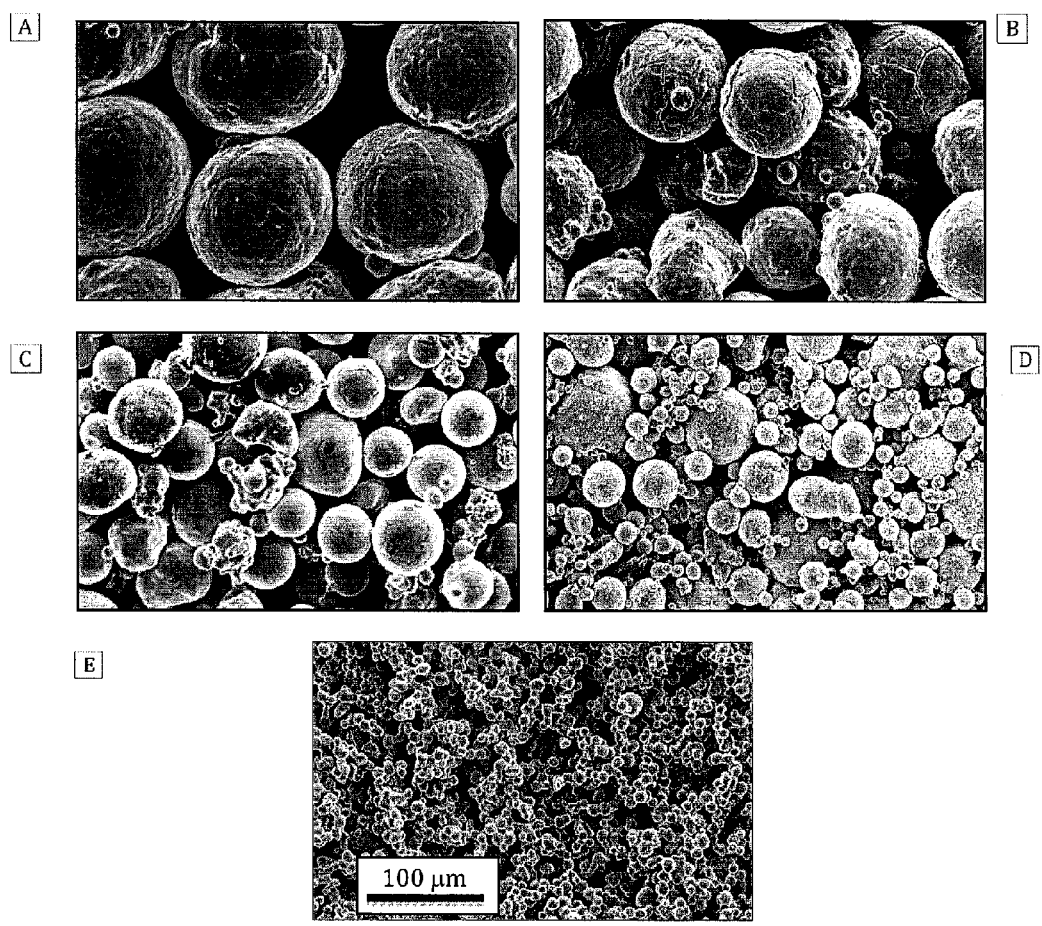
FIG. 12 shows the scanning electron micrographs of five sizes of spherical copper particles that were used to fabricate exemplary microstructured wicks.

Five sizes of spherical copper particles were used to fabricate the microstructured wicks as shown in Table 1 and in the scanning electron micrographs (SEMs) in FIG. 12.

TABLE 1

Sintered wick samples and fabrication details

| Sample | Particle Size (μm) | Sintering Temp. (° C.) | Sintering Time (min) |
|--------|-------------------|------------------------|----------------------|
| A | 120-140 | 850 | 30 |
| B | 75-100 | 850 | 30 |
| C | 40-90 | 850 | 30 |
| D | 0.5-150 | 850 | 30 |
| E | 5-15 | 700 | 15 |

While the smallest particles (sample E) were commercially available, the larger powders were sieved to achieve the respective sizes. Powder sample E has been selected for the fine condenser wick and the various larger powders were investigated to determine the optimal coarse wick. The powders were loose-sintered in a 150 mm diameter tube furnace (HTF55667C, Lindberg-Blue) with a heating rate of 20° C./min. To minimize shrinkage, the smaller particles were sintered at lower temperatures and times. A reducing atmosphere of 5% H2, 95% N2 was employed in positive pressure to remove existing oxidation on the particles and prevent oxidation during heating. The wicks were fabricated in copper tubes with an inner diameter of 4.8 mm. As the copper particles sinter, they bind to the tube and form a plug. The maximum capillary pressure (MCP) that can be sustained across the wick interface is related to the effective pore radius ($r_{\it eff}$) by the Young-Laplace relation:

$$\Delta P_{max} = \frac{2\sigma \cos \alpha}{r_{\it eff}} \quad (1)$$

where σ and α are the surface tension of the liquid and the contact angle, respectively. The pressure drop for flow through the wick is related to the permeability (κ) and flow rate (Q) by Darcy's Law:

$$\Delta P = \frac{\mu l}{A_{cs} \kappa} Q \quad (2)$$

where μ, l, and Acs are the viscosity of the fluid, flow length, and cross sectional area of the porous media, respectively. Equations (1) and (2) were used to characterize the effective pore size and permeability from experimental data.

Figure 10:
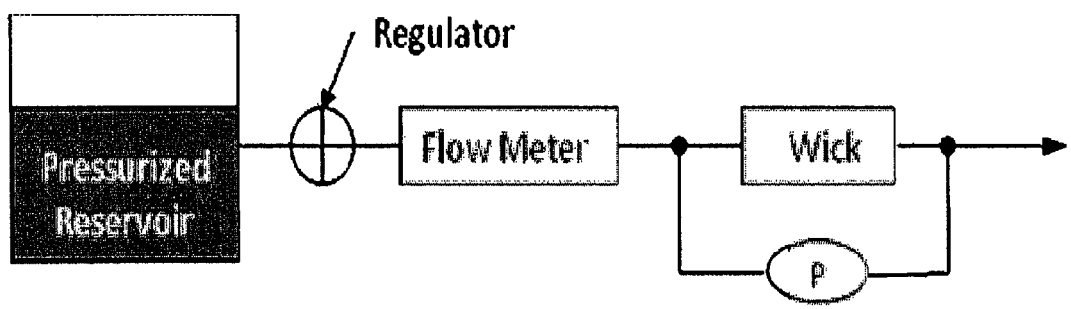
FIG. 10 shows a schematic of a experimental setup used to characterize the permeability and MCP for different samples.

FIG. 10 shows a schematic of the experimental setup used to characterize the permeability and MCP for each sample. A pressurized reservoir was used to drive water through a flow meter (L-5CCM-D, Alicat Scientific) and then the wick. A regulator controlled the driving pressure, and a differential pressure transducer (FDW1AT, Honeywell) measured the pressure drop through the wick.

Figure 11:
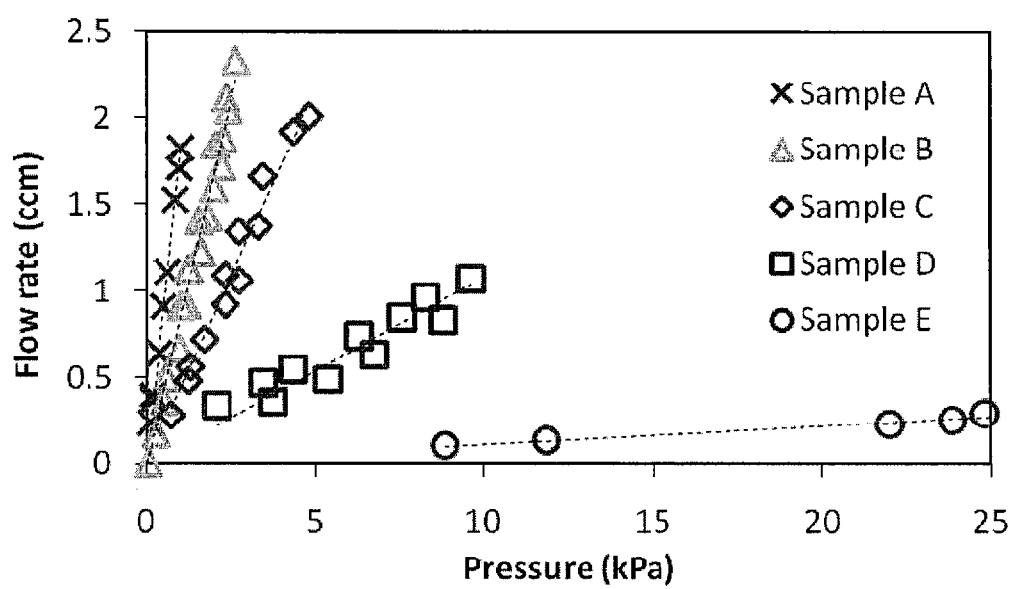
FIG. 11 shows characterization results of flow rate as a function of driving pressure for different samples.

FIG. 11 shows characterization results of flow rate as a function of driving pressure for each sample. Table 2 lists the permeabilities determined using Equation (2).

TABLE 2

Sintered wick characterization results

| Sample | Particle Size (m) | Permeability (m²) | Capillary Press (Pa) | Eff. Pore Size (μm) |
|--------|-------------------|-------------------|----------------------|---------------------|
| A | 120-140 | 1.5E-11 +/- 7.5E-13 | 98 +/- 37 | 155 |
| B | 75-100 | 8.3E-12 +/- 2.3E-12 | 303 +/- 214 | 50 |
| C | 40-90 | 3.6E-12 +/- 1.3E-12 | 380 +/- 195 | 40 |
| D | 0.5-150 | 9.1E-13 +/- (NA) | NA | NA |
| E | 5-15 | 9.3E-14 +/- (NA) | 770 +/- 43 | 20 |

In general, larger particle sizes lead to higher flow rates for a given pressure drop. The inclusion of a wider range of particle sizes, however, adversely affects the permeability. Sample D, with particle sizes ranging from 0.5-150 μm shows a higher flow resistance than A and B. The smaller particles in sample D fill the voids between the larger particles, which reduces the permeability. Large particles, sieved to a narrow range, result in the highest permeability (sample A).

The MPC was measured by introducing water to the samples and slowly increasing the backside pressure until the liquid penetrates through the wick. The measured MCPs of the wicks are tabulated in Table 2 based on an assumed advancing contact angle of 84°

Figure 9:
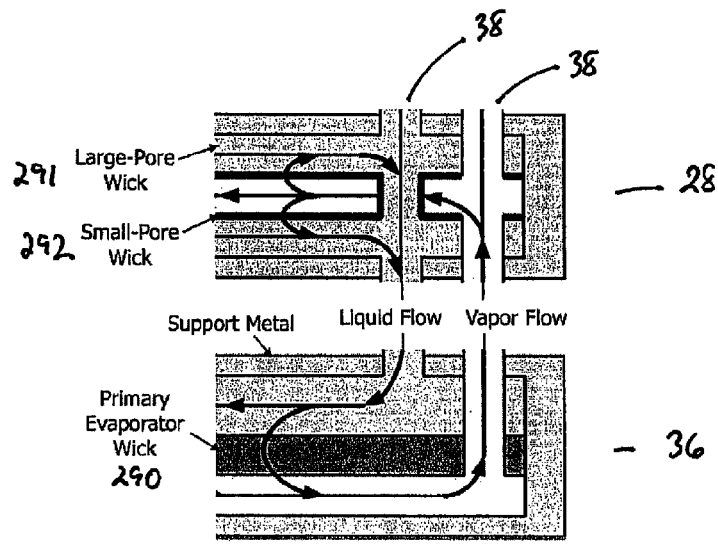
FIG. 9 shows an embodiment of a dual-layer planar wick structure.

To fabricate a dual-layer planar wick structure, as shown in FIG. 9, the MCP of a coarse high permeability wick was increased by completely filling the surface voids with finer particles. A graphite mold was first filled with the 40-90 µm powder, and then refilled at the surface with the 5-15 µm powder. The excess was scraped off of the surface. The powder was sintered at 850° C. for 30 minutes with the procedure described above.

Figure 13:
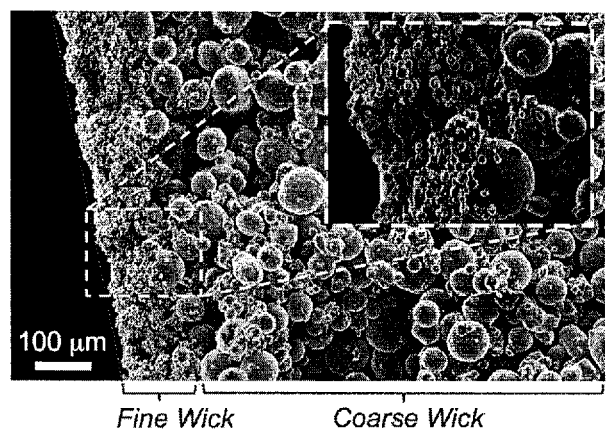
FIG. 13 shows a cross-sectional SEM of a dual-layer wick.

FIG. 13 shows a cross-sectional SEM of the dual-layer wick. The fine powder fills the surface to a depth of approximately 1.5 times the diameter of the coarse powder. The results suggest that adding a powder of intermediary particle size between the two layers more effectively fills interstitial voids. This results in a thinner fine wick layer and higher permeability.

All references, such as patents, patent applications, and publications, referred to above are incorporated by reference in their entirety.

Still other embodiments are within the scope of the following claims.

What is claimed is:

1. A device comprising:
   a thermal contact plate defining a cavity in fluid communication with first and second pipes;
   a plurality of stationary elements substantially perpendicular to the first pipe that carries predominantly vaporized working fluid, each stationary element defining a cavity, wherein each cavity is in fluid communication with the first pipe, and at least one cavity comprises a wick;
   a second pipe in fluid communication with the cavities in the stationary elements that carries predominantly liquid working fluid back to the thermal contact plate cavity wherein the wick is also located throughout the second pipe, and not located in the first pipe;
   a plurality of movable elements, wherein the moveable elements and the stationary elements are substantially parallel, alternatingly arranged, and a portion of the movable elements overlaps a portion of the stationary elements; and
   a working fluid in the first and second pipes and cavities, or in the stationary elements and thermal contact plate.

2. The device of claim 1, wherein the wick comprises sintered particles.

3. The device of claim 1, wherein the wick comprises a series of pillars with a height in the range of approximately 10 µm to approximately 100 µm, a width in the range of approximately 500 nm to approximately 50 µm and a length in the range of approximately 500 nm to approximately 50 µm and a pitch in the range of approximately 500 nm to approximately 50 µm.

4. The device of claim 1, having a total volume of not more than about 64 cubic inches.

5. The device of claim 1, having overall dimensions in the range of about 5 cm to about 10 cm, by about 5 cm to about 10 cm, by about 5 cm to about 10 cm.

6. The device of claim 1, wherein the stationary element, movable element, thermal contact plate, or heat pipe comprises a material selected from the group consisting of copper, aluminum, silicon, graphite, steel, stainless steel, titanium, diamond, silver, graphene, alloys thereof and combinations thereof.

7. The device of claim 1, wherein the working fluid is selected from the group consisting of water, ammonia, methanol, ethanol, and combinations thereof.

8. The device of claim 1, wherein the working fluid has a vaporization temperature in the range of from approximately 40° C. to approximately 150° C.

9. The device of claim 1 wherein the stationary element and associated pipe sections are constructed from a monoblock.

10. The device of claim 1, wherein the pipe has a diameter of less than about 1 mm.

11. The device of claim 1, wherein the pipe has a diameter of less than about 5 mm.

12. The device of claim 1, having an overall thermal resistivity less than about 0.5 K/W.

13. The device of claim 1, wherein the device can dissipate between about 0.25 kW to about 1 kW of heat.

* * * * *